(12) United States Patent
Lee

(10) Patent No.: US 7,295,071 B1
(45) Date of Patent: Nov. 13, 2007

(54) HIGH SPEED, HIGH DC GAIN AND WIDE DYNAMIC RANGE AMPLIFIER

(75) Inventor: Bumba Lee, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 131 days.

(21) Appl. No.: 11/339,716

(22) Filed: Jan. 24, 2006

Related U.S. Application Data

(60) Provisional application No. 60/717,904, filed on Sep. 16, 2005.

(51) Int. Cl.
*H03F 3/45* (2006.01)

(52) U.S. Cl. ...................................... 330/258; 330/260

(58) Field of Classification Search ................ 330/258, 330/292
See application file for complete search history.

(56) References Cited

U.S. PATENT DOCUMENTS 6,353,361 B1 * 3/2002 Sun ............................ 330/253

2006/0290426 A1 * 12/2006 Chen et al. ................. 330/253

OTHER PUBLICATIONS

Lee et al., A 14bit 155MSPS Pipelined CMOS ADC with 84.6dB SFDR at 117MHz, Santa Clara, California, 13 pages.

* cited by examiner

*Primary Examiner*—Steven J. Mottola
(74) *Attorney, Agent, or Firm*—Patent Law Group LLP; Carmen C. Cook

(57) ABSTRACT

A two-stage amplifier circuit fabricated in a dual gate oxide fabrication process having thick gate oxide devices as high voltage MOS transistors and thin gate oxide devices as low voltage MOS transistors includes a first stage amplifier and a second stage amplifier. The first stage amplifier receives a first pair of differential input voltages and provides a first pair of differential output voltages referenced to a first output common mode voltage. The second stage amplifier receives the first pair of differential output voltages of the first stage amplifier and provides a second pair of differential output voltages referenced to a second output common mode voltage. The first and second pair of input transistors are low voltage MOS transistors and the first output common mode voltage has a voltage value that is minimized to maximize the voltage swing of the second pair of differential output voltages.

13 Claims, 3 Drawing Sheets

HIGH SPEED, HIGH DC GAIN AND WIDE DYNAMIC RANGE AMPLIFIER

CROSS-REFERENCE TO RELATED APPLICATION

This application claims the benefit of U.S. Provisional Patent Application Ser. No. 60/717,904, filed on Sep. 16, 2005, having the same inventorship hereof, which application is incorporated herein by reference in its entirety.

FIELD OF THE INVENTION

The invention relates to amplifier circuits and, in particular, to an amplifier circuit capable of high speed of operation, high DC gain and wide dynamic range.

DESCRIPTION OF THE RELATED ART

Amplifier is a key block in analog and/or mixed mode electronic devices and its performance often limits the performance of the whole electronic device. For instance, a 14-bit one hundred mega samples per second (MSPS) pipeline analog-to-digital converter (ADC) requires an amplifier having a DC voltage gain of about 100,000 times (100 dB), a closed loop bandwidth of higher than 300 MHz and a wide output swing for higher dynamic range with given thermal noise level. High performance analog circuits are frequently implemented with 3V supply voltage in order to achieve higher dynamic range aided by wide output swing, like 2Vp-p differentially even though lower supply voltage is available for use in smaller device processes.

FIG. 1 is a circuit diagram of a conventional gain-boosted telescopic amplifier. Referring to FIG. 1, amplifier circuit 10 includes low voltage MOS transistors MN1 and MN2 forming the input pair of the amplifier. In the amplifier circuit of FIG. 1, low voltage transistors MN1 and MN2 can be used because the input common mode voltage and the drain-to-source voltage of the input pair can be tightly controlled to be less than the process limit of the transistors for long term reliability. In general, high speed low voltage transistor devices (e.g. transistors MN1 and MN2) are used to form the input pair in order to attain wider bandwidth and less parasitic capacitance due to the gate-to-source capacitance of the input pair. In amplifier circuit 10, four gain-boosting amplifiers are used to obtain high DC voltage gain with a small sacrifice in the output voltage swing. Specifically, amplifiers AMPN1 and AMPN2 are coupled to NMOS cascode transistors MN3 and MN4 while amplifiers AMPP1 and AMPP2 are coupled to PMOS cascode transistors MP1 and MP2. In the conventional amplifier circuit, NMOS cascode transistors MN3 and MN4 and PMOS cascode transistors MP1 and MP2 are implemented using low speed high voltage transistor devices.

The output voltage swing of the differential output voltages OUTN and OUTP can be limited due to the cascoded transistors (MN3, MN4, MP1 and MP2) connected between the output nodes and the positive supply voltage VDD or ground (GND). Furthermore, even more DC gain can be substantially reduced due to the large impact ionization current from the drain node to the substrate of the NMOS cascode transistors MN3 and MN4 when the amplifier output voltage reaches a high voltage value. It is well known that NMOS transistors are much more fragile to impact ionization effect due to the higher carrier velocity as compared to PMOS transistors with the same geometry and electric field across the drain to source of the transistor.

Even after the aforementioned issues can be overcome with certain design techniques, an additional limitation of this conventional amplifier topology is that a low frequency parasitic pole is located at the source nodes of the cascoded NMOS transistors MN3 and MN4. In the present configuration, the parasitic pole is the second pole of the amplifier and limits the maximum closed loop bandwidth of the amplifier circuit. Specifically, the frequency of the parasitic pole is given as:

$$P = \frac{g_m}{C_t},$$

where $g_m$ is the transconductance of the cascode NMOS transistor MN3 or NM4 and $C_t$ is the total capacitive loading on the source node (node 12 or 14) of the cascode transistor MN3 or MN4. In other words, capacitance $C_t$ is the sum of the source-to-gate capacitance of the cascode NMOS transistor (MN3 or MN4), the input equivalent capacitance of the gain-boosting amplifier (AMPN1 or AMPN2) and the drain-to-gate capacitance of the input transistor (MN1 and MN2).

FIG. 2 is a circuit diagram of a conventional two-stage amplifier. Referring to FIG. 2, by using a two-stage amplifier configuration, amplifier circuit 20 improves the output voltage swing and the DC voltage gain as compared to the single stage amplifier circuit of FIG. 1. However, the operating speed of amplifier circuit 20 is limited by the second pole, which is a function of the transconductance of input transistors MN5 and MN6 of the second stage amplifier and the equivalent loading capacitance on the output nodes 22, 24 of the input transistors. In the conventional two-stage amplifier of FIG. 2, input transistors MN5 and MN6 of the second stage amplifier are implemented as low speed high voltage transistors.

The amplifier circuit shown in FIG. 1 can be used as the first stage amplifier as is or with minor modifications. The second pole in the first stage amplifier becomes the third pole for the two-stage amplifier 20 and this third pole location is at a low frequency which may limit the maximum achievable operating speed of the two-stage amplifier circuit. Impact ionization current on the first stage amplifier output nodes (nodes 16 and 18) can be minimized with proper output common mode setting so that the DC voltage gain is not affected by the large output voltage swing on the second stage output nodes 22, 24. Even large impact ionization current on the second stage amplifier output nodes (22, 24) does not reduce over all amplifier DC voltage gain since the DC gain contributed by the second stage amplifier is much smaller than that of the first stage amplifier.

An amplifier circuit which can overcome the shortcomings of the conventional circuits and is capable of high speed of operation, high DC gain and wide dynamic range is desired.

SUMMARY OF THE INVENTION

According to one embodiment of the present invention, a two-stage amplifier circuit fabricated in a dual gate oxide fabrication process having thick gate oxide devices as high voltage MOS transistors and thin gate oxide devices as low voltage MOS transistors includes a first stage amplifier and a second stage amplifier. The first stage amplifier includes a pair of differential input terminals coupled to a first pair of input transistors for receiving a first pair of differential input voltages referenced to a first input common mode voltage and a pair of differential output terminals providing a first pair of differential output voltages referenced to a first output common mode voltage. The second stage amplifier includes a pair of differential input terminals coupled to a second pair of input transistors for receiving the first pair of differential output voltages of the first stage amplifier and a pair of differential output terminals providing a second pair of differential output voltages referenced to a second output common mode voltage. The first and second pair of input transistors are low voltage MOS transistors and the first output common mode voltage has a voltage value that is minimized to maximize the voltage swing of the second pair of differential output voltages.

The present invention is better understood upon consideration of the detailed description below and the accompanying drawings.

DETAILED DESCRIPTION OF THE PREFERRED EMBODIMENTS

Figure 1:
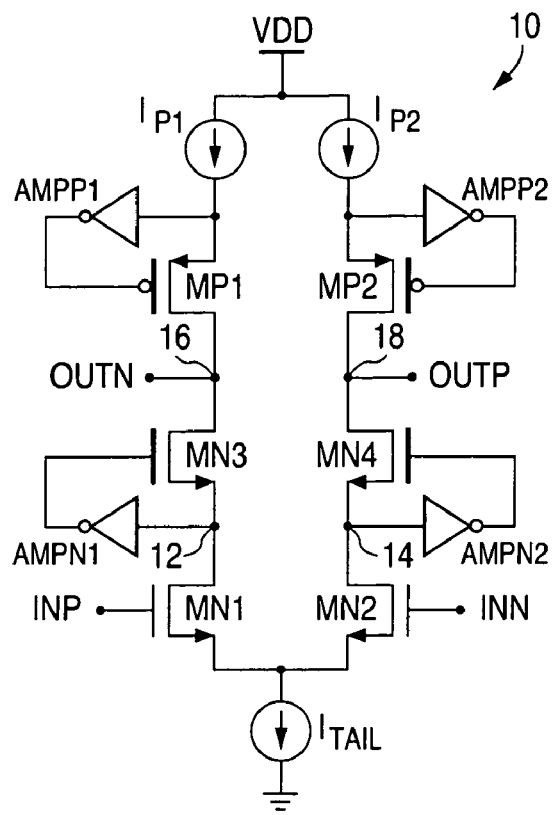
FIG. 1 is a circuit diagram of a conventional gain-boosted telescopic amplifier.

In accordance with the principles of the present invention, a two-stage amplifier is fabricated using a dual gate oxide process having thick gate oxide devices as low speed high voltage MOS transistors and thin gate oxide devices as high speed low voltage MOS transistors. The two-stage amplifier includes only high speed low voltage transistors in the signal path of the differential input signal and the amplifier is operated under a power supply voltage designated for the high voltage transistors to realize a high speed, high DC voltage gain, and wide dynamic range amplifier circuit. That is, the two-stage amplifier does not use any low speed high voltage transistors in the signal path as is done in the conventional circuits. The high speed, high gain two-stage amplifier is realized by precisely controlling the common mode voltage at the output voltage node of each amplifier stage and by managing the parasitic capacitance in the amplifier circuit.

When the output common mode voltage of the two-stage amplifier is properly controlled, impact ionization at the source/drain terminals of the low voltage MOS transistors is avoided and the two-stage amplifier ensures long-term device reliability. When low voltage transistors are used to reduce the parasitic capacitances of the two-stage amplifier, the locations of the parasitic poles are at high frequencies so that the amplifier can operate at high speed without stability issue.

In one embodiment, the amplifier circuit is fabricated in a 0.18 μm DGO (dual-gate oxidation) CMOS fabrication process. The low voltage transistors in the signal path of the two-stage amplifier are implemented using the 0.18 μm thin gate oxide NMOS transistors with bigger transconductance but smaller parasitic capacitance. Low speed high voltage transistors not in the signal path are implemented using 0.35 μm thick gate oxide PMOS OR NMOS transistors. The amplifier circuit is operated by a 3.3V supply voltage designated for the high voltage transistors. In this embodiment, long term device reliability of the amplifier circuit is guaranteed as long as the output voltage swing of the amplifier circuit is kept to 2Vp-p (peak-to-peak) and the output common mode voltage of the first stage amplifier is kept to about 1.1V and the output common mode voltage of the second stage amplifier is kept to 1.5V or below. When only high speed low voltage transistors are used in the signal path of the amplifier circuit, DC voltage gain reduction at large output voltage swing due to the impact ionization current effect and due to low frequency parasitic poles location is obviated.

In one application, the two-stage amplifier is implemented in a 14-bit over 100 MSPS ADC where the amplifier provides superior performance. One advantage of the two-stage amplifier circuit is that the amplifier circuit can accommodate output common mode voltages and output voltage swing that are commonly used in conventional amplifier circuits so that the two-stage amplifier circuit of the present invention can be readily applied in any circuit applications to replace existing amplifier circuits with undesired performance characteristics.

In the figures accompanying the present description, transistors illustrated with a thick line at the gate terminal depict high voltage MOS transistors, such as the 0.35 μm devices, and transistors illustrated with a thin line at the gate terminal depict low voltage MOS transistors, such as 0.18 μm devices, in a dual gate oxide fabrication process.

Figure 3:
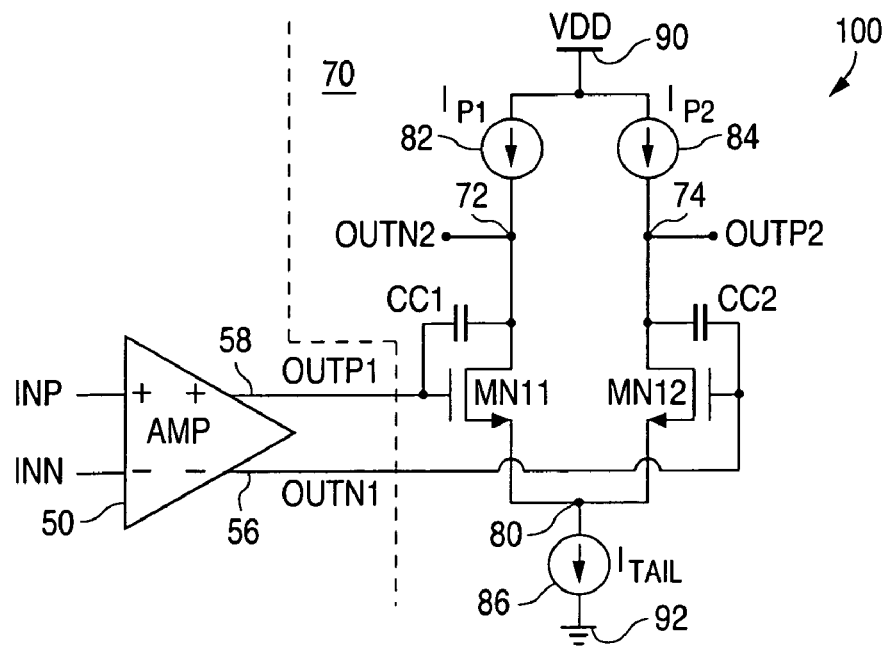
FIG. 3 is a circuit diagram of a two-stage amplifier according to one embodiment of the present invention.
Figure 4:
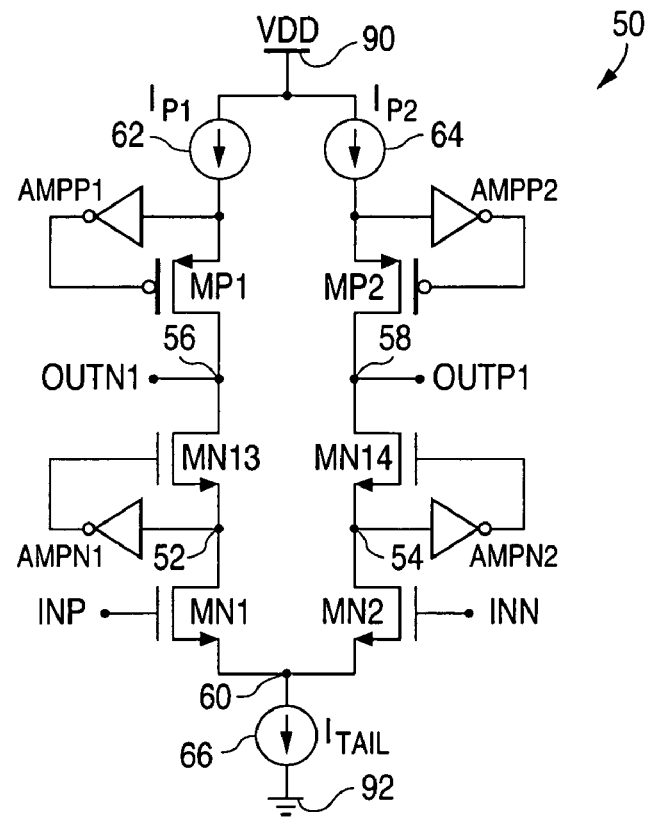
FIG. 4 is a circuit diagram of a gain-boosted telescopic amplifier which can be used to implement the first stage amplifier in the amplifier circuit of FIG. 3 according to one embodiment of the present invention.

FIG. 3 is a circuit diagram of a two-stage amplifier according to one embodiment of the present invention. FIG. 4 is a circuit diagram of a gain-boosted telescopic amplifier which can be used to implement the first stage amplifier in the amplifier circuit of FIG. 3 according to one embodiment of the present invention.

Referring first to FIG. 3, two-stage amplifier 100 includes a first stage amplifier 50 and a second stage amplifier 70. First stage amplifier 50, also referred to as a preamplifier, receives a pair of differential input signals INN and INP on its differential input terminals and provides a pair of differential output signals OUTN1 and OUTP1 on output nodes 56 and 58. Output signals OUTP1 and OUTN1 are coupled to the second stage amplifier 70 which is a differential amplifier. Specifically, output signals OUTP1 and OUTN1 of the first stage amplifier 50 are coupled to a pair of input transistors MN11 and MN12 of the second stage amplifier 70. Current sources 82 and 84, providing currents $I_{P1}$ and $I_{P2}$, function as the current load for the input pair MN11 and MN12, respectively. A current source 86 provides a tail current $I_{TAIL}$ for the common source node of the input pair MN11 and MN12. Compensation capacitors CC1 and CC2 are coupled between the drain and gate terminals of input transistors MN11 and MN12, respectively. The second stage amplifier 70 provides a pair of differential output signals OUTN2 and OUTP2 at output nodes 72 and 74.

Figure 2:
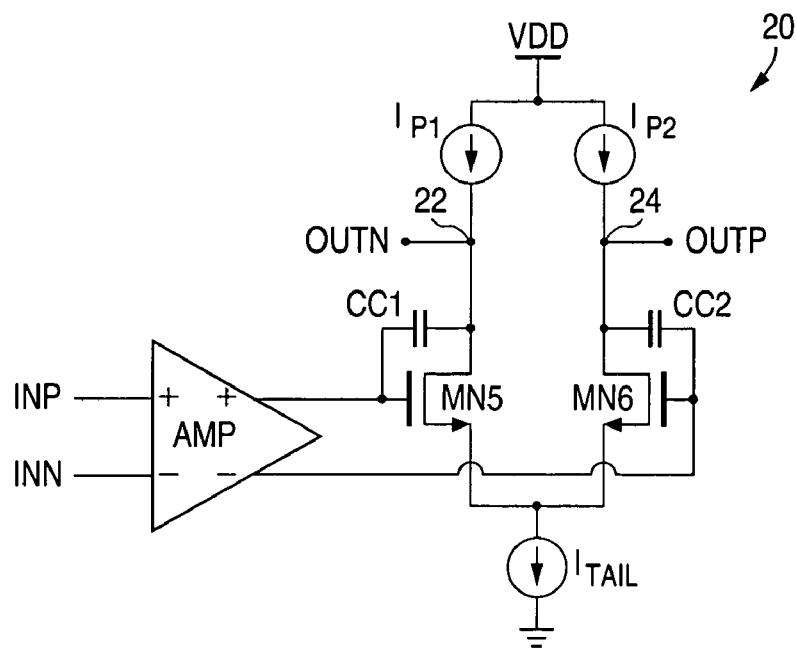
FIG. 2 is a circuit diagram of a conventional two-stage amplifier.

Two-stage amplifier 100 is fabricated using a dual gate oxide fabrication process having thick gate oxide devices as low speed high voltage MOS transistors and thin gate oxide devices as high speed low voltage MOS transistors. In accordance with the present invention, the second stage amplifier 70 includes only low voltage NMOS transistors in the signal path in order to achieve higher operating speed. That is, input transistor pair MN11 and MN12 is implemented as low voltage NMOS transistors, as opposed to the high voltage transistors used in the conventional systems, such as transistors MN5 and MN6 of the amplifier of FIG. 2. Furthermore, two-stage amplifier 100 is operated with a VDD voltage (node 90) designated for the high voltage devices so that the second stage amplifier 70 can attain a high dynamic range in output voltages.

In one embodiment, the two-stage amplifier 100 is fabricated using a 0.18 µm dual gate oxidation CMOS process where the low voltage devices are 0.18 µm gate oxide devices and the high voltage devices are 0.35 µm gate oxide devices. A power supply VDD voltage of 3.3V, designated for the high voltage devices, is used. The input common mode voltage is about 0.8V. For the given fabrication process and operating conditions, the output common mode voltages of the first and second stage amplifiers are precisely managed to realize the desired high speed, high DC gain and wide dynamic range amplifier.

The output common mode voltages for the amplifier stages are selected as follows. First, the output voltage swing for second stage amplifier 70 is set to a maximum value without causing reliability issues at the output transistors. Then, an output common mode voltage for the second stage amplifier 70 is selected to have a voltage value that is typically used for high voltage MOS transistors in conventional amplifier circuit. Then, the output common mode voltage for the first stage amplifier 50 is selected where the output common mode voltage of the first stage amplifier is minimized to realize the widest voltage swing at the output voltage nodes of the second stage amplifier 70.

In one embodiment, the output common mode voltage is 1.1V for the first stage amplifier 50 and 1.5V or below for the second stage amplifier 70 when a 3.3V power supply voltage VDD is used. In operation, the first stage amplifier has an output voltage swing of 0.1V (0.2Vp-p) about the output common mode voltage of 1.1V (from 1.05V to 1.15V). Meanwhile, the output voltage swing for the second stage amplifier is 2Vp-p, that is 1V about the output common mode voltage of 1.5V (1V to 2V). In operation, the first stage amplifier provides majority of the required DC gain while the second stage amplifier provides the remaining required DC gain. In the present embodiment, the first stage amplifier provides a 10,000×DC voltage gain while the second stage amplifier provides a 10×DC voltage gain.

In the second stage amplifier, the output voltage swing for conventional amplifier circuits is about VDD/2. For a 3.6V power supply, the output swing is therefore about 1.8V. However, in accordance with the present invention, the output common mode voltage of the second stage amplifier is limited to 1.5V so that the output voltage can swing from 1V to 2V. When the common source node 80 is at about 0.4V, there is a maximum of 1.6V across the source and drain terminals of input transistors MN11 and MN12. In this manner, long term device reliability is assured since drain node voltages of MN11 and MN12 are within the fabrication process limitation.

When the output common mode voltages are properly managed, impact ionization effect at the first and second stage amplifiers are minimized or completely eliminated so that long term device reliability can be guaranteed for 2Vp-p output voltage swing with sufficient margin. When the output common mode voltage of the second stage amplifier 70 is kept at 1.5V or below, the maximum voltage at the output nodes (72 and 74) of the second stage amplifier 70 is allowed up to about 2V and thus the drain-to-source voltage of the input transistor pair MN11 and MN12 is restricted.

In sum, the output common mode voltages of the first stage and the second stage amplifiers of the two-stage amplifier circuit of the present invention are precisely managed so that the output common mode voltage of the first stage amplifier is kept as low as possible to maximize the output voltage swing of the second stage amplifier while ensuring that the drain-to-source voltages of the input transistors of the second stage amplifier are not subjected to undesirable voltage levels.

Furthermore, the output voltage range and the output common mode voltage of the second stage amplifier used by the two-stage amplifier of the present invention accommodate values used by conventional implementations involving high voltage transistors. Thus, the two-stage amplifier circuit of the present invention can be readily adapted into any existing design to realize a maximum operating speed by more than 2 times that of the conventional amplifiers.

Turning to FIG. 4, a single stage gain-boosted telescopic amplifier 100 which can be used to implement the first stage amplifier of the two-stage amplifier 100 of FIG. 3 includes low voltage NMOS transistors MN1 and MN2 as the input transistors. In the present embodiment, cascode NMOS transistors MN13 and MN14 are implemented as thin gate oxide, high speed, low voltage NMOS transistors. Cascode PMOS transistors MP1 and MP2 and the associated current sources 62 and 64 are implemented using thick oxide high voltage PMOS transistors.

In the present embodiment, the gain-boosting amplifiers AMPN1 and AMPN2 are implemented using only low voltage NMOS transistors. The gain-boosting amplifiers AMPP1 and AMPP2 are implemented using high voltage PMOS transistors.

The long term reliability of amplifier circuit 50 can be guaranteed as long as the voltage from drain-to-source and drain-to-gain terminals of the cascode transistor MN13 and MN14 is kept low, such as less than 2.0V for a 3.3V supply voltage, across the entire operating range of the amplifier 50. However, when used as a standalone amplifier, the maximum DC voltage gain of amplifier 50 is not satisfying due to the low output resistance of the low voltage NMOS transistors MN13 and MN14. Furthermore, the larger impact ionization current from the output nodes 56, 58 to the substrate under a large signal condition can reduce the DC voltage gain even further. Thus, amplifier 50 is best applied as a first stage amplifier in a multi-stage amplifier circuit.

When implemented as a two-stage amplifier circuit, the first stage amplifier using amplifier 50 of FIG. 4 provides a large portion of the desired overall voltage gain while providing limited DC output voltage swing. The second stage amplifier provides a small portion of the overall voltage gain while providing a large output voltage swing.

When cascode NMOS transistors MN13 and MN14 are implemented as low voltage NMOS transistors, impact ionization at the drain terminals (nodes 56, 58) of transistors MN13 and MN14 can become severe. Therefore, the output common mode voltage of amplifier 50 must be kept as low as possible and the output voltage swing must be limited to lessen the impact ionization effect. When the output voltage swing of the first stage amplifier is limited to a small value, such as 0.2Vp-p, the differential output voltages are held almost steady at a low voltage value. Thus, undesired impact ionization effect at the drain terminals of low voltage transistors MN13 and MN14 is avoided.

A key advantage of amplifier 50 is that the parasitic capacitance of the circuit is dramatically reduced by the use of low voltage NMOS transistors as cascode transistors MN13 and MN14. Because the low voltage NMOS transistors can have a smaller device area to achieve a high transconductance, the parasitic capacitance of the low voltage NMOS transistors is much reduced. The reduced parasitic capacitance increases the parasitic pole frequency at the source nodes (nodes 52 or 54) of the low voltage cascode NMOS transistor MN13 and MN14, thereby providing more design margin and ensuring high gain at high operation speed. In one embodiment, the pole frequency location is increased by more than 2 times as compared to the pole frequency of the amplifier in FIG. 1. When high voltage transistors are used as the cascode transistors, a large device area is required to ensure a sufficiently high transconductance so that very high parasitic capacitance results. The conventional amplifier circuit includes poles that are located at too low a frequency for adequate high speed operation.

Figure 5:
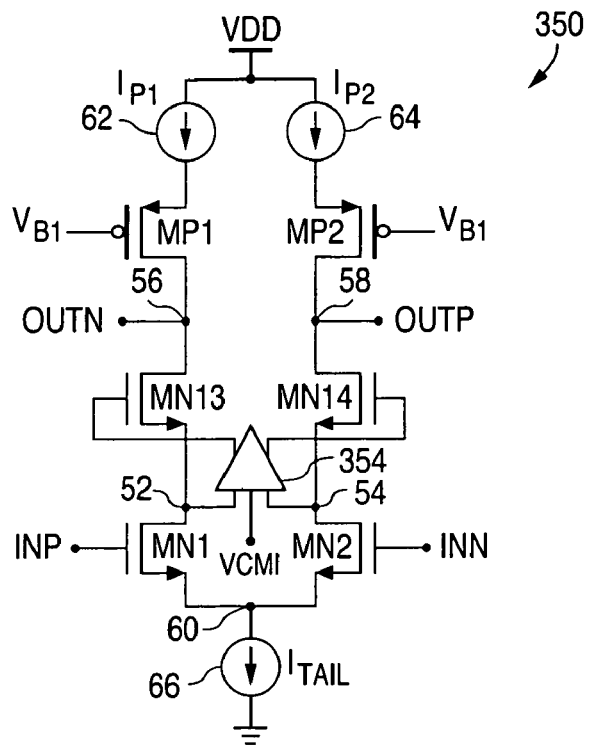
FIG. 5 is a circuit diagram of an amplifier which can be used to implement the first stage amplifier of the two-stage amplifier of FIG. 3 according to another embodiment of the present invention.

In the present description, amplifier 50 of FIG. 4 used to implement the first stage amplifier of two-stage amplifier 100 uses amplifier loops as the gain-boosting amplifiers to drive the cascode NMOS and PMOS transistors. In other embodiments, the gain-boosting amplifier loop for the CMOS output transistors can be implemented using a differential amplifier loop as shown in FIG. 5. Furthermore, double cascoded high voltage PMOS transistors can be included to achieve improved slewing behavior at the PMOS transistor circuit. FIG. 5 is a circuit diagram of an amplifier 350 which can be used to implement the first stage amplifier of the two-stage amplifier of FIG. 3 according to another embodiment of the present invention. In the amplifier 350 of FIG. 5, gain-boosting for cascoded NMOS transistors MN13 and MN14 is provided by a differential amplifier 354. Differential amplifier 354 receives the drain voltages from the pair of input transistors MN1 and MN2 as well as the input common mode voltage VCMI of the first stage amplifier.

Returning to FIG. 3, in the two-stage amplifier 100, the current source circuits 82, 84 and any loading transistors can be implemented using high voltage MOS transistors as these transistors are not in the signal path. High voltage transistors are preferred for the PMOS transistors to allow a higher Vdd voltage to be used so as to realize a larger output voltage swing.

Figure 6:
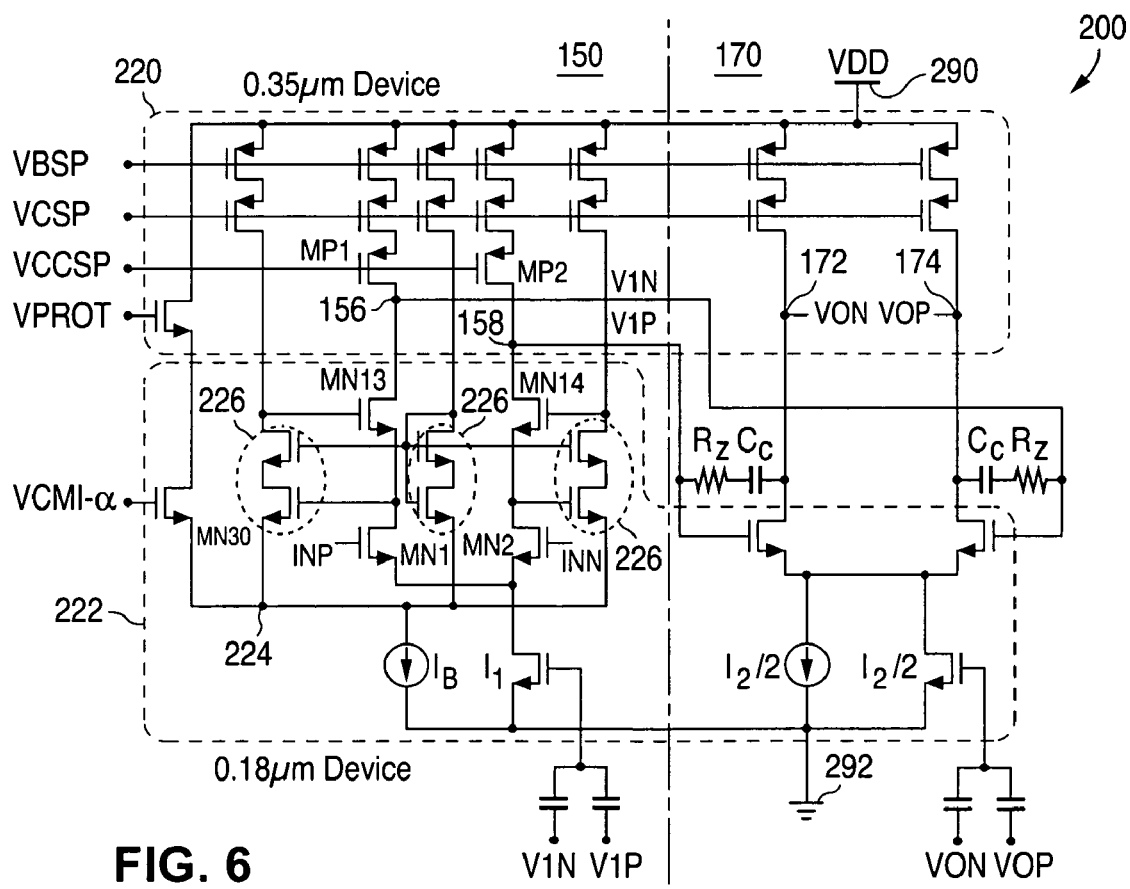
FIG. 6 is a transistor-level circuit diagram of a two-stage amplifier according to a second embodiment of the present invention.

FIG. 6 is a transistor-level circuit diagram of a two-stage amplifier according to a second embodiment of the present invention. Referring to FIG. 6, two-stage amplifier 200 includes a first stage amplifier 150 and a second stage amplifier 170. In the first stage amplifier 150, cascoded NMOS transistors MN13 and MN14 are gain-boosted by differential amplifier loop such as that shown in FIG. 5. Two-stage amplifier 200 is fabricated using a 0.18 μm dual gate oxide CMOS process. MOS Transistors in dotted box 222 are 0.18 μm low voltage devices while MOS transistors in dotted box 220 are 0.35 μm high voltage devices. (In FIG. 6, the high voltage transistors in box 220 are not denoted by thick gate lines as in the previous figures.) The Vdd voltage is 3.3 to 3.6V.

With 1.1V as the first stage amplifier's output common mode voltage and 1.5V as the second stage amplifier's output common mode voltage, none of 0.18 μm NMOS transistors' gate-to-source voltage ($V_{GS}$), the gate-to-drain voltage ($V_{GD}$) and the drain-to-source voltage ($V_{DS}$) are exposed to voltages higher than the process limits even during slewing. Furthermore, in the present embodiment, the first stage amplifier 150 uses a differential amplifier loop, such as that shown in FIG. 5, to provide gain-boosting for the cascode NMOS transistors MN13 and MN14. The differential amplifier 226 is coupled to receive input voltages from the drain terminals of the input transistors MN1 and MN2 and also receive an input common mode voltage at node 224. Differential amplifier 226 is coupled to drive the gate terminals of cascode NMOS transistors MN13 and MN14.

In the embodiment shown in FIG. 5, the gain-boosting differential amplifier is described as receiving the same input common mode voltage VCMI of the amplifier. However, in the present embodiment, the gain-boosting amplifier receives an input common mode voltage which is derived from but may be different than the amplifier input common mode voltage (VCMI). Specifically, the input common mode voltage for the gain-boosting differential amplifier and other bias voltages for the cascode transistors are locally generated from the amplifier input common mode voltage (VCMI). Furthermore, the cascode transistors are self-biasing and the biasing voltage will vary with Vdd variations and process variation, rendering the operation of the amplifier circuit insensitive to process variations.

In the embodiment shown in FIG. 6, a particular feature of two-stage amplifier 200 is that the input common mode voltage VCMI coupled to an input node (node 224) of the gain-boosting differential amplifier is shifted down by a small DC voltage from the input common mode voltage VCMI. By lowering the input common mode voltage coupled to the gain-boosting differential amplifier by a small amount, the output common mode voltage of the first stage amplifier 150 is also lowered so as to increase the output voltage swing of the output voltages V1N and V1P. As a result, a bigger output voltage swing on the second stage amplifier output signals VON and VOP is realized.

In one embodiment, the input common mode voltage is reduced by about 100~200 mV before being coupled to the gain-boosting differential amplifier. In the embodiment shown in FIG. 6, a reduced input common mode voltage VCMI-α is coupled as a gate voltage to an NMOS transistor MN30. The voltage reduction factor α is on the order of 100~200 mV in the present embodiment. A reduced input common mode voltage thus appears on the source terminal (node 224) of transistor MN30 where the reduced voltage is coupled as the input common mode voltage to the gain-boosting differential amplifier 226. The use of a reduced input common mode voltage VCMI-A as a gate voltage to drive NMOS transistor MN30 to generate a reduced input common mode voltage for the gain-boosting differential amplifier 226 is illustrative only. In other embodiments, other circuit configurations for reducing the input common mode voltage by a small amount can also be used. For example, in one alternate embodiment, the input common mode voltage VCMI can be coupled directly to transistor MN30 as the gate voltage and a resistor coupled between the source terminal of transistor MN30 and node 224 can then be used to generate the reduced input common mode voltage. In another alternate embodiment, the input common mode voltage VCMI can be coupled directly to transistor MN30 where transistor MN30 is configured with reduced channel width to increase the current density so that the voltage at the source terminal of the transistor is reduced.

Furthermore, in the present embodiment, a zero insertion resistor ($R_Z$) cancels one of high order poles for better phase margin. Also, the tail current source of the second stage amplifier 170 is divided by half into a constant current source and a common mode feedback current source for less bias current fluctuation during slewing. The two-stage amplifier 200 of FIG. 6 is capable of achieving above 100 dB of DC gain, higher than 500 MHz −3 dB loop bandwidth and >2VP-P swing with 3.0~3.6V of supply voltage and −40~85° C. of temperature range.

In the implementation shown in FIG. 6, the first stage amplifier 150 does not include any gain boosting amplifier for cascode transistors MN13 and MN14 or for cascode transistors MP1 and MP2. This is because the amplifier already has sufficient gain. Furthermore, a differential amplifier stage 226 is used to boost the gain for cascode transistors MN13 and MN14 to realize a better power rejection ratio.

The above detailed descriptions are provided to illustrate specific embodiments of the present invention and are not intended to be limiting. Numerous modifications and variations within the scope of the present invention are possible. The present invention is defined by the appended claims.

I claim:

1. A two-stage amplifier circuit fabricated in a dual gate oxide fabrication process having thick gate oxide devices as high voltage MOS transistors and thin gate oxide devices as low voltage MOS transistors, the two-stage amplifier circuit comprising:

a first stage amplifier comprising a pair of differential input terminals coupled to a first pair of input transistors for receiving a first pair of differential input voltages referenced to a first input common mode voltage and a pair of differential output terminals providing a first pair of differential output voltages referenced to a first output common mode voltage; and a second stage amplifier comprising a pair of differential input terminals coupled to a second pair of input transistors for receiving the first pair of differential output voltages of the first stage amplifier and a pair of differential output terminals providing a second pair of differential output voltages referenced to a second output common mode voltage, wherein the first and second pair of input transistors are low voltage MOS transistors and the first output common mode voltage has a voltage value that is minimized to maximize the voltage swing of the second pair of differential output voltages.

2. The two-stage amplifier circuit of claim 1, wherein the two-stage amplifier circuit is coupled to a positive power supply voltage having a first value designated for high voltage MOS transistors and the second output common mode voltage is less than one-half of the first value and the first output common mode voltage is less than the second output common mode voltage.

3. The two-stage amplifier circuit of claim 2, wherein the dual gate oxide fabrication process includes 0.35 µm thick gate oxide MOS transistors and 0.18 µm thin gate oxide MOS transistors, the positive power supply voltage has a voltage value of 3.3 volts, the first output common mode voltage has a value of 1.1 volts and the second output common mode voltage has a value of 1.5 volts or less.

4. The two-stage amplifier circuit of claim 1, wherein the second output common mode voltage has a voltage value suitable for high voltage MOS transistors.

5. The two-stage amplifier circuit of claim 1, wherein the first stage amplifier comprises a gain-boosted telescopic amplifier.

6. The two-stage amplifier circuit of claim 5, wherein the first stage amplifier comprises:

a pair of NMOS transistors as the pair of input transistors, the gate terminals of the NMOS transistors receiving the respective differential input signals, the source terminals of the NMOS transistors being coupled together to a tail current source and the drain terminals of the NMOS transistors being coupled to respective first and second nodes;

a first cascode NMOS transistor having a source terminal coupled to the first node, a drain terminal being a first one of the differential output terminals and a gate terminal;

a second cascode NMOS transistor having a source terminal coupled to the second node, a drain terminal being a second one of the differential output terminals and a gate terminal;

a first amplifier having an input terminal coupled to the first node and an output terminal driving the gate terminal of the first cascode NMOS transistor; and a second amplifier having an input terminal coupled to the second node and an output terminal driving the gate terminal of the second cascode NMOS transistor, wherein the pair of NMOS input transistors and the first and second cascode NMOS transistors comprise low voltage NMOS transistors.

7. The two-stage amplifier circuit of claim 6, wherein the first stage amplifier further comprises:

a first cascode PMOS transistor having a source terminal coupled to a first current source, a drain terminal coupled to the first one of the differential output terminals and a gat terminal;

a second cascode PMOS transistor having a source terminal coupled to a second current source, a drain terminal coupled to the second one of the differential output terminals and a gat terminal;

the first and second current sources being coupled between a positive power supply voltage and the respective source terminals of the first and second cascode PMOS transistors;

a third amplifier having an input terminal coupled to the source terminal of the first cascode PMOS transistor and an output terminal driving the gate terminal of the first cascode PMOS transistor; and a fourth amplifier having an input terminal coupled to the source terminal of the second cascode PMOS transistor and an output terminal driving the gate terminal of the second cascode PMOS transistor, wherein the first and second cascode PMOS transistors comprise high voltage PMOS transistors.

8. The two-stage amplifier circuit of claim 5, wherein the first stage amplifier comprises:

a pair of NMOS transistors as the pair of input transistors, the gate terminals of the NMOS transistors receiving the respective differential input signals, the source terminals of the NMOS transistors being coupled together to a tail current source and the drain terminals of the NMOS transistors being coupled to respective first and second nodes;

a first cascode NMOS transistor having a source terminal coupled to the first node, a drain terminal being a first one of the differential output terminals and a gate terminal;

a second cascode NMOS transistor having a source terminal coupled to the second node, a drain terminal being a second one of the differential output terminals and a gate terminal; and a differential amplifier having a pair of differential input terminals coupled to the first and second nodes, a common mode voltage input terminal coupled to receive a voltage indicative of the first input common mode voltage and a pair of differential output terminals coupled to drive the gate terminals of the first and second cascode NMOS transistors, wherein the pair of NMOS input transistors and the first and second cascode NMOS transistors comprise low voltage NMOS transistors.

9. The two-stage amplifier circuit of claim 8, wherein the first stage amplifier further comprises:

a first cascode PMOS transistor having a source terminal coupled to a first current source, a drain terminal coupled to the first one of the differential output terminals and a gat terminal coupled to receive a first bias voltage;

a second cascode PMOS transistor having a source terminal coupled to a second current source, a drain terminal coupled to the second one of the differential output terminals and a gat terminal coupled to receive the first bias voltage; and the first and second current sources being coupled between a positive power supply voltage and the respective source terminals of the first and second cascode PMOS transistors, wherein the first and second cascode PMOS transistors comprise high voltage PMOS transistors.

10. The two-stage amplifier circuit of claim 8, wherein the common mode voltage input terminal of the differential amplifier receives a voltage that is less than the first input common mode voltage.

11. The two-stage amplifier circuit of claim 10, wherein the common mode voltage input terminal of the differential amplifier receives a voltage that is 100-200 mV less than the first input common mode voltage.

12. The two-stage amplifier circuit of claim 1, wherein the second stage amplifier comprises a differential amplifier.

13. The two-stage amplifier circuit of claim 12, wherein the second stage amplifier comprises:

first and second NMOS transistors as the pair of input transistors, the gate terminals of the NMOS transistors receiving the first pair of differential output voltages, the source terminals of the NMOS transistors being coupled together to a tail current source and the drain terminals of the NMOS transistors being the pair of differential output terminals providing the second pair of differential output voltages;

a first current source coupled between a positive power supply voltage and the drain terminal of the first NMOS transistor;

a second current source coupled between the positive power supply voltage and the drain terminal of the second NMOS transistor;

a first capacitor coupled between the gate and drain terminals of the first NMOS transistor; and a second capacitor coupled between the gate and drain terminals of the second NMOS transistor, wherein the first and second NMOS transistors comprise low voltage NMOS transistors.

* * * * *

UNITED STATES PATENT AND TRADEMARK OFFICE
CERTIFICATE OF CORRECTION

PATENT NO.        : 7,295,071 B1
APPLICATION NO. : 11/339716
DATED             : November 13, 2007
INVENTOR(S)       : Bumha Lee It is certified that error appears in the above-identified patent and that said Letters Patent is hereby corrected as shown below:

Title page, line 75: Please correct inventor name to Bumha Lee

Signed and Sealed this

Twenty-third Day of September, 2008

JON W. DUDAS
*Director of the United States Patent and Trademark Office*